United States Patent
Hein

(10) Patent No.: US 7,454,306 B2
(45) Date of Patent: Nov. 18, 2008

(54) FREQUENCY MARGIN TESTING

(75) Inventor: Jerrell P. Hein, Driftwood, TX (US)

(73) Assignee: Silicon Laboratories Inc., Austin, TX (US)

( * ) Notice: Subject to any disclaimer, the term of this patent is extended or adjusted under 35 U.S.C. 154(b) by 162 days.

(21) Appl. No.: 11/148,995

(22) Filed: Jun. 9, 2005

(65) Prior Publication Data

US 2006/0294409 A1  Dec. 28, 2006

(51) Int. Cl.
*G01M 19/00* (2006.01)
*G06F 19/00* (2006.01)
*G01R 23/00* (2006.01)
*G01R 31/00* (2006.01)
*G01R 31/14* (2006.01)

(52) U.S. Cl. .......................... 702/125; 702/75; 702/117

(58) Field of Classification Search .................. 702/125, 702/117, 75
See application file for complete search history.

(56) References Cited

U.S. PATENT DOCUMENTS

| | | | |
|---|---|---|---|
| 5,451,912 A | 9/1995 | Torode | |
| 6,556,593 B1* | 4/2003 | Herkersdorf et al. | 370/532 |
| 2002/0149435 A1* | 10/2002 | Babcock | 331/158 |
| 2004/0148121 A1* | 7/2004 | de Obaldia et al. | 702/117 |
| 2004/0153267 A1* | 8/2004 | Fishman et al. | 702/69 |
| 2005/0079822 A1* | 4/2005 | Boose et al. | 455/67.11 |

OTHER PUBLICATIONS

"CVPD-970 Model 9X14 mm SMD, 3.3V, LVPECL Differential LVPECL VCXO," Crystek Crystals Corporation, TD-030607 Rev. A, 2 pages.

Jerrell P. Hein and Mike Petrowski, "DSP-driven high-performance clock sources radically alter system timing architectures," Silicon Laboratories Inc., Mar. 2005, 7 pages.

H. Werker, et al., "A 10Gb/s SONET-Compliant CMOS Transceiver with Low Cross-Talk and Intrinsic Jitter," 2004 IEEE International Solid-State Circuits Conference, ISSCC 2004/Session 9/GBIT-Transceivers/9.4, 0-7803-8267-6/04, 10 pages.

"3.3V 28Mbps-2.7Gbps AnyRate™ Clock and Data Recovery with Integrated Clock Multiplier Unit," SY87721L, Rev. A, Amendment /0, Micrel-Synergy, Oct. 2001, pp. 1-15.

* cited by examiner

*Primary Examiner*—Eliseo Ramos-Feliciano
*Assistant Examiner*—Janet L Suglo
(74) *Attorney, Agent, or Firm*—Zagorin O'Brien Graham LLP

(57) ABSTRACT

A technique for performing frequency margin testing of communications system circuit boards incorporates a frequency agile clock source on a communications system circuit board. The clock source may be programmed to operate the circuit board at a nominal operating frequency and at frequencies suitable to characterize actual and/or apparent frequency tolerances of the circuit board. The technique maintains transmission line integrity of the on-board clock.

17 Claims, 5 Drawing Sheets

FREQUENCY MARGIN TESTING

BACKGROUND

1. Field of the Invention

This application relates to integrated circuit devices and more particularly to frequency margin testing of integrated circuit devices.

2. Description of the Related Art

High-performance (i.e., high-speed and low jitter) system applications such as Synchronous Optical Network (SONET), Synchronous Digital Hierarchy (SDH), or 10 Gigabyte Ethernet (10 GbE) typically use precision timing sources to transmit, receive and perform other data processing functions on a communication data stream. Clocks based on high Q elements, e.g. crystal oscillators, surface acoustic wave (SAW) oscillators, ceramic oscillators, and micro-electro mechanical system (MEMS) oscillators may be used to generate low jitter, high frequency timing signals. However, clocks generated from high Q elements typically have fixed frequencies or may vary only a few hundred ppm away from nominal frequencies.

The substantially fixed frequency nature of such clocks presents a challenge for testing circuits dependent on those clocks over a suitable frequency range to guarantee design timing margin. Frequency margin testing of circuits on a typical communications system board may utilize duplicate fixed frequency oscillators, selectable via a high-speed multiplexer. During testing, the multiplexer is controlled to run the system board at nominal, nominal plus margin, and nominal minus margin rates by selecting appropriate ones of the fixed frequency oscillators. A typical margin may be approximately 10 percent of the nominal rate. Correct system operation for all three clock rates is believed to guarantee adequate timing margin.

This approach includes multiple oscillators on the system board, increasing component costs and board area, yet only one of these multiple oscillators is used during normal operation of the system board. The high-speed multiplexer logic for switching between clock sources increases component costs and board area. Furthermore, the number of clock sources included on the board generally determines the number of predetermined frequencies that may be used for testing the frequency margin. In general, the board cannot be stressed until failure to determine an actual frequency margin for the board.

Another approach for frequency margin testing introduces externally generated test clocks during board testing. This approach typically dedicates board space for probe points to allow connection of an external clock source. These probe points can degrade the transmission line characteristics of the board traces and lower clock performance. In addition, one or more external, high-performance, frequency agile clock sources may be used for board testing, thus increasing costs, especially for concurrent testing of multiple boards.

Accordingly, improved techniques for performing frequency margin testing of communications system circuit boards are desired.

SUMMARY

A technique for performing frequency margin testing of communications system circuit boards incorporates a frequency agile clock source on a communications system circuit board. The clock source may be programmed to operate the circuit board at a nominal operating frequency and at frequencies suitable to characterize actual and/or apparent frequency tolerances of the circuit board. The technique maintains transmission line integrity of the on-board clock.

At least one embodiment of the present invention includes a circuit board and a frequency agile clock source supplying an operational clock signal to one or more circuits on the circuit board. The frequency agile clock source comprises a substantially fixed frequency oscillator and a programmable oscillator coupled to the substantially fixed frequency oscillator. The frequency agile clock source is programmable to adjust frequency of the operational clock signal to determine a frequency tolerance of the circuit board.

In at least one embodiment of the present invention, a method includes providing an operational clock signal to at least one circuit on a circuit board. The operational clock signal is based on a substantially fixed frequency signal provided by an oscillator on the circuit board. The operational clock has a programmable frequency. The method includes varying the operational clock signal to determine a frequency tolerance of the circuit board based on the operational clock signal.

In at least one embodiment of the present invention, a method includes providing an operational clock signal on a circuit board from a frequency agile clock source on the circuit board. The method includes varying the operational clock signal above and below a nominal operating frequency of the operational clock signal to determine whether the circuit board meets a frequency tolerance specification for the circuit board.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
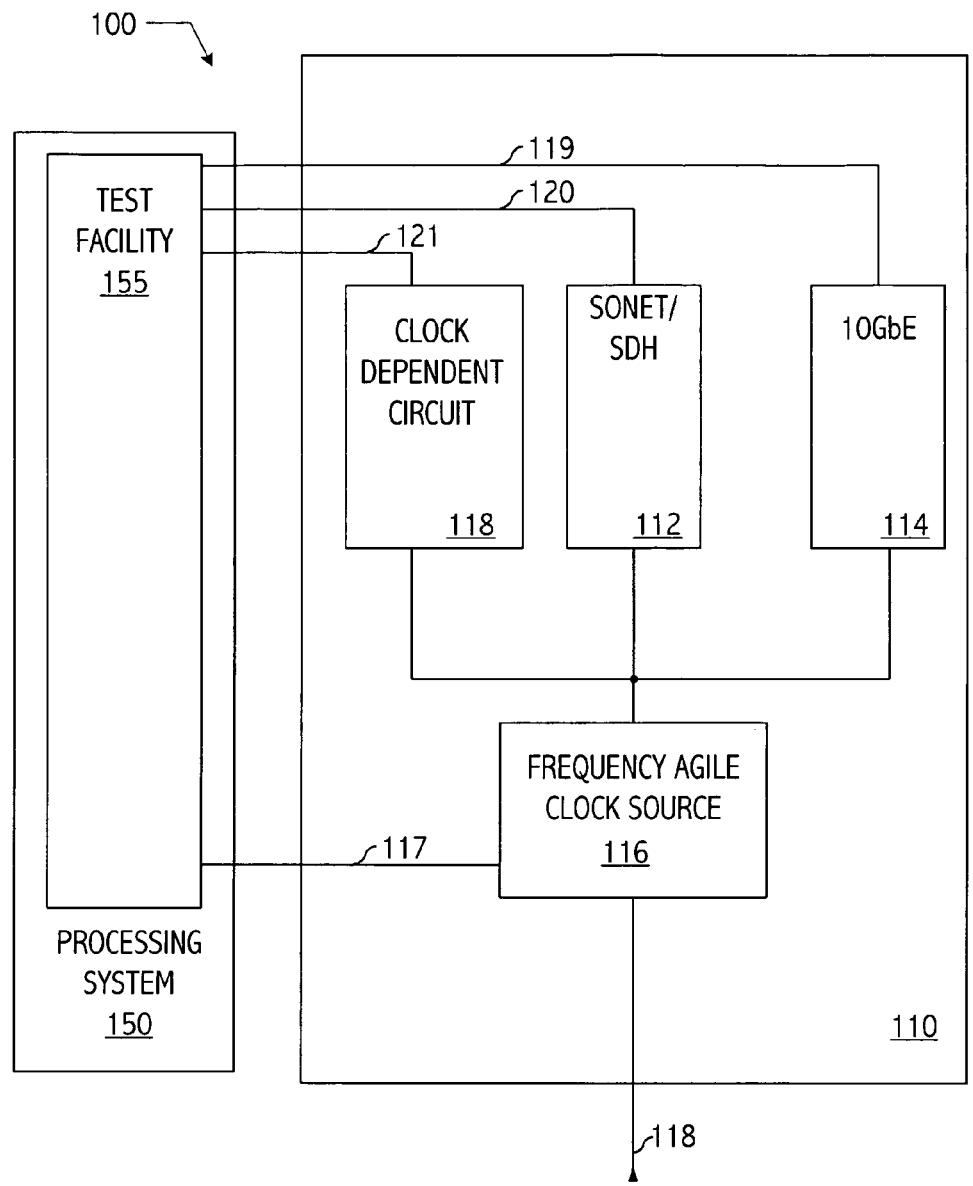
FIG. 1 illustrates a block diagram of a circuit board assembly being tested under control of a processing system consistent with at least one embodiment of the present invention.

Referring to FIG. 1, a system for frequency margin testing a communications system circuit board (e.g., system 100) includes a circuit board (e.g., circuit board 110) coupled to a processing system (e.g., processing system 150). Circuit board 110 includes at least one clock dependent circuit (e.g., general clock dependent circuit 118, SONET/SDH circuit 112, 10 GbE circuit 114, or other suitable circuit). The clock dependent circuit may be required to meet a system specification. For example, an operational range of frequencies for SONET/SDH circuit 112 may be compared to SONET or SDH specifications Other circuits on the system board may be evaluated according to other suitable specifications.

Figure 2:
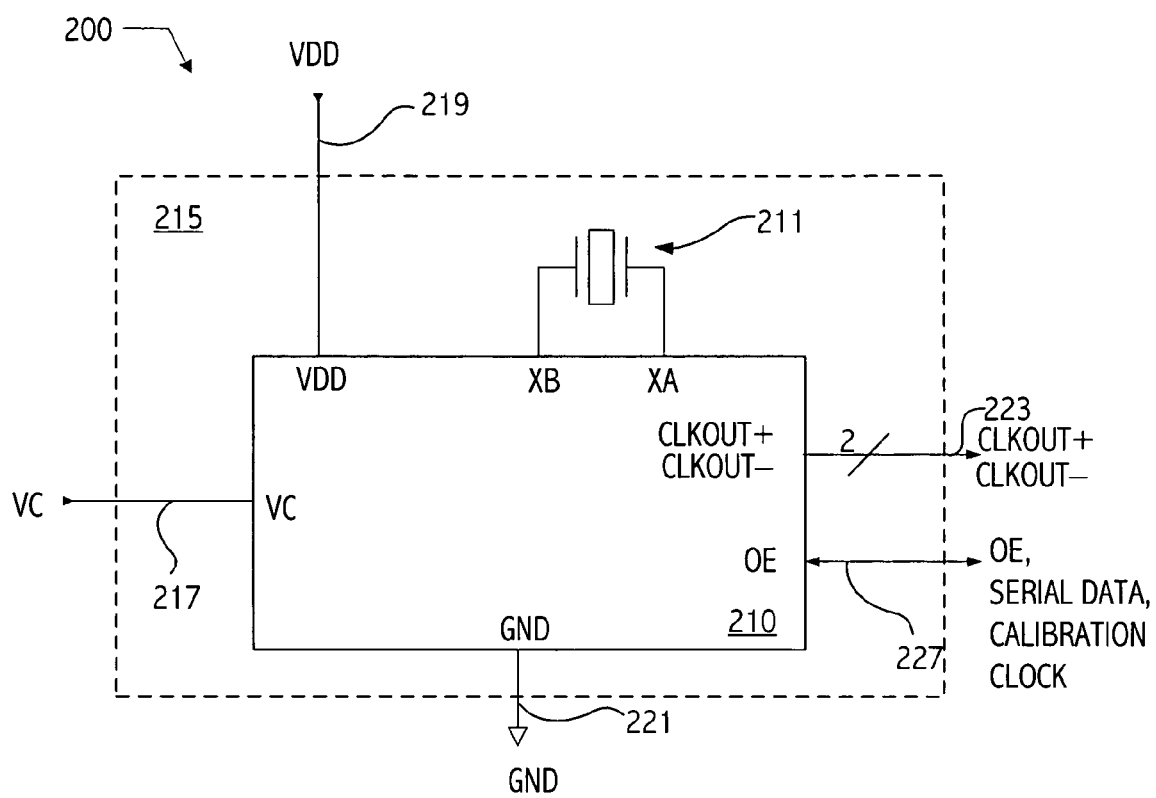
FIG. 2 illustrates a block diagram of a frequency agile integrated circuit clock source consistent with at least one embodiment of the present invention.
Figure 3:
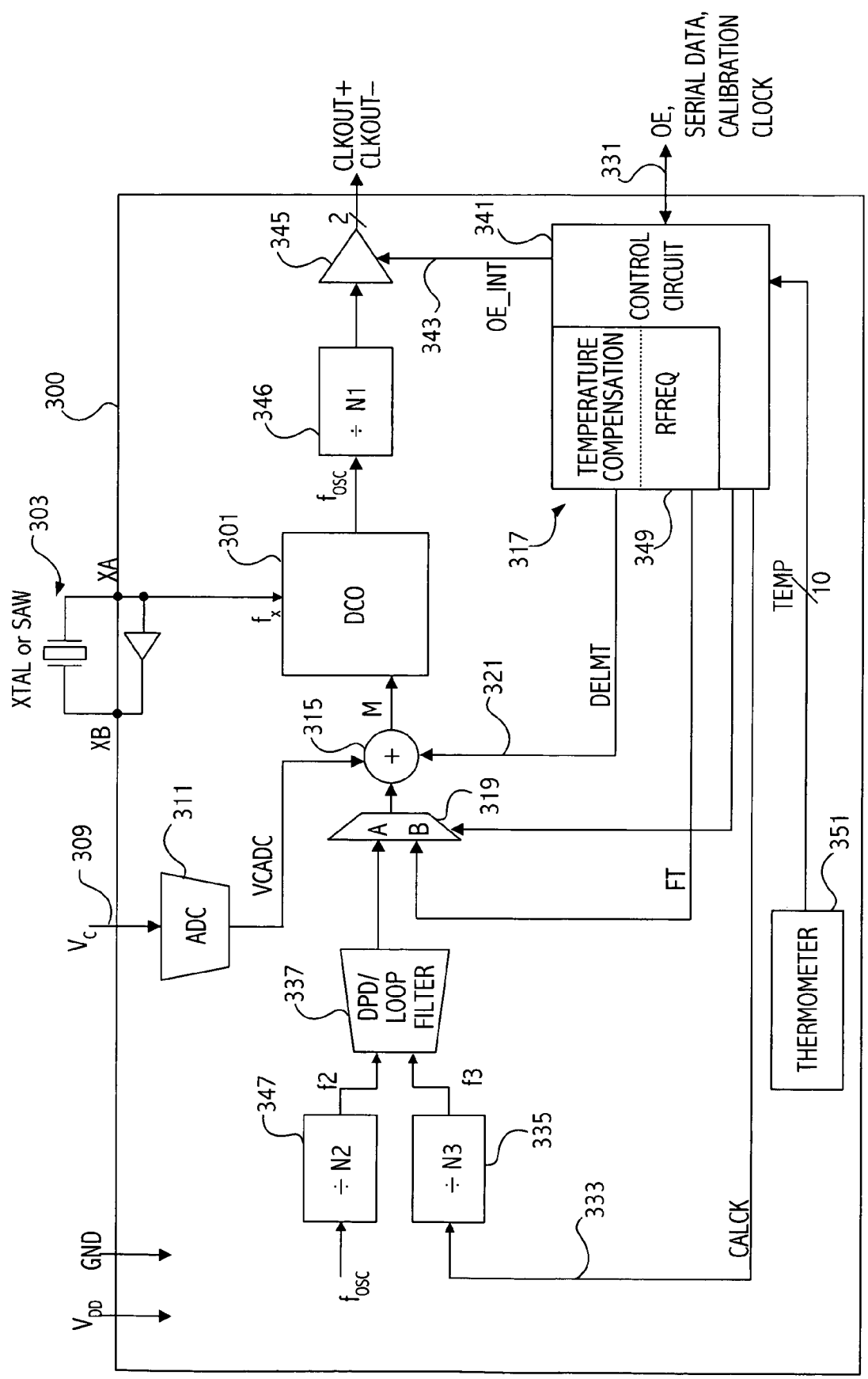
FIG. 3 illustrates a block diagram of an exemplary frequency agile integrated circuit clock source consistent with at least one embodiment of the present invention.

In at least one embodiment of the present invention, frequency agile clock source 116 is a programmable clock source used to provide an operational clock to SONET/SDH circuit 112, 10 GbE circuit 114, and clock dependent circuit 118. Frequency agile clock source 116 includes a substantially fixed frequency oscillator coupled to a programmable oscillator. Referring to FIG. 2, exemplary frequency agile clock source 200 includes an integrated circuit 210 including a programmable oscillator and coupled to a high Q oscillator element that generates a substantially fixed frequency signal, e.g., crystal 211. In at least one embodiment of the invention, both integrated circuit 210 and crystal 211 are packaged in a standard ceramic package 215 that is utilized for packaging a voltage controlled crystal oscillator (VCXO). Note that another clock element that generates a substantially fixed frequency signal, e.g., a surface acoustic wave (SAW) oscillator, ceramic oscillator, micro-electro mechanical system (MEMS) oscillator or other appropriate clock element, may be utilized in place of crystal 211. In the illustrated embodiment, package 215 includes standard input/output signals including a voltage control input 217, a power input 219, a ground input 221, differential clock outputs 223, and an output enable (OE) pin 227. Referring to FIG. 3, a block diagram illustrates an embodiment of integrated circuit 210 described in U.S. patent application Ser. No. 10/878,218, entitled "Dual Loop Architecture Useful for a Programmable Clock Source and Clock Multiplier Applications", published as Published Application Number 20040232995 A1, Nov. 25, 2004, naming Thomsen et al. as inventors, which is incorporated herein by reference.

Referring back to FIG. 1, frequency agile clock source 116 may be programmed to provide an operational clock for clock dependent circuits on circuit board 110. The operational clock provided by frequency agile clock source 116 may have a frequency within a range around a nominal operating frequency. For example, frequency agile clock source 116 may provide an operational clock signal within +/−20 ppm of a nominal operating frequency of a clock dependent circuit receiving the clock signal, which is comparable to the frequency provided by a typical high Q clock source. Frequency agile clock source 116 may provide an operational clock signal having jitter less than approximately 1 picosecond rms for jitter frequencies ranging from 50 kHz to 80 MHz.

However, in addition to providing a low jitter operational clock signal to a clock dependent circuit included on circuit board 110, frequency agile clock source 116 is capable of providing test clock signals for use in characterizing the clock dependent circuits included on circuit board 110 and therefore characterizing the circuit board. In various embodiments of the present invention, frequency agile clock source 116 provides a clock with a frequency within a range between approximately plus or minus one, five, ten, or twenty percent of the nominal operating frequency of the clock dependent circuit and/or is programmable in increments of approximately 10 ppm or less of the nominal operating frequency.

In an exemplary embodiment of the present invention, frequency agile clock source 116 may be programmed via programming terminal 117 which is coupled to a processing system, e.g., processing system 150 executing test facility 155. Test facility 155 can program the frequency of the clock signal produced by frequency agile clock source 116, e.g., to verify the operation of circuit board 110. In at least one embodiment of the present invention, frequency agile clock source 116 receives a voltage control signal from voltage control terminal 118. The programming or control signals cause the frequency of the clock signal produced by frequency agile clock source 116 to vary, which may be useful for circuit board testing or characterization. In at least one embodiment of the present invention, programming terminal 117 may be used to receive an output enable signal for clock source 116, in place of, or in addition to, serial programming signals. The portions of test facility 155 that involve changing the frequency of a clock produced by the frequency agile clock source may be performed using voltage control terminal 118 or programming terminal 117 or some combination thereof. In at least one embodiment, frequency agile clock source 116 includes software and/or hardware to perform the functions of test facility 155 without any external input other than a test initiation signal.

Figure 4:
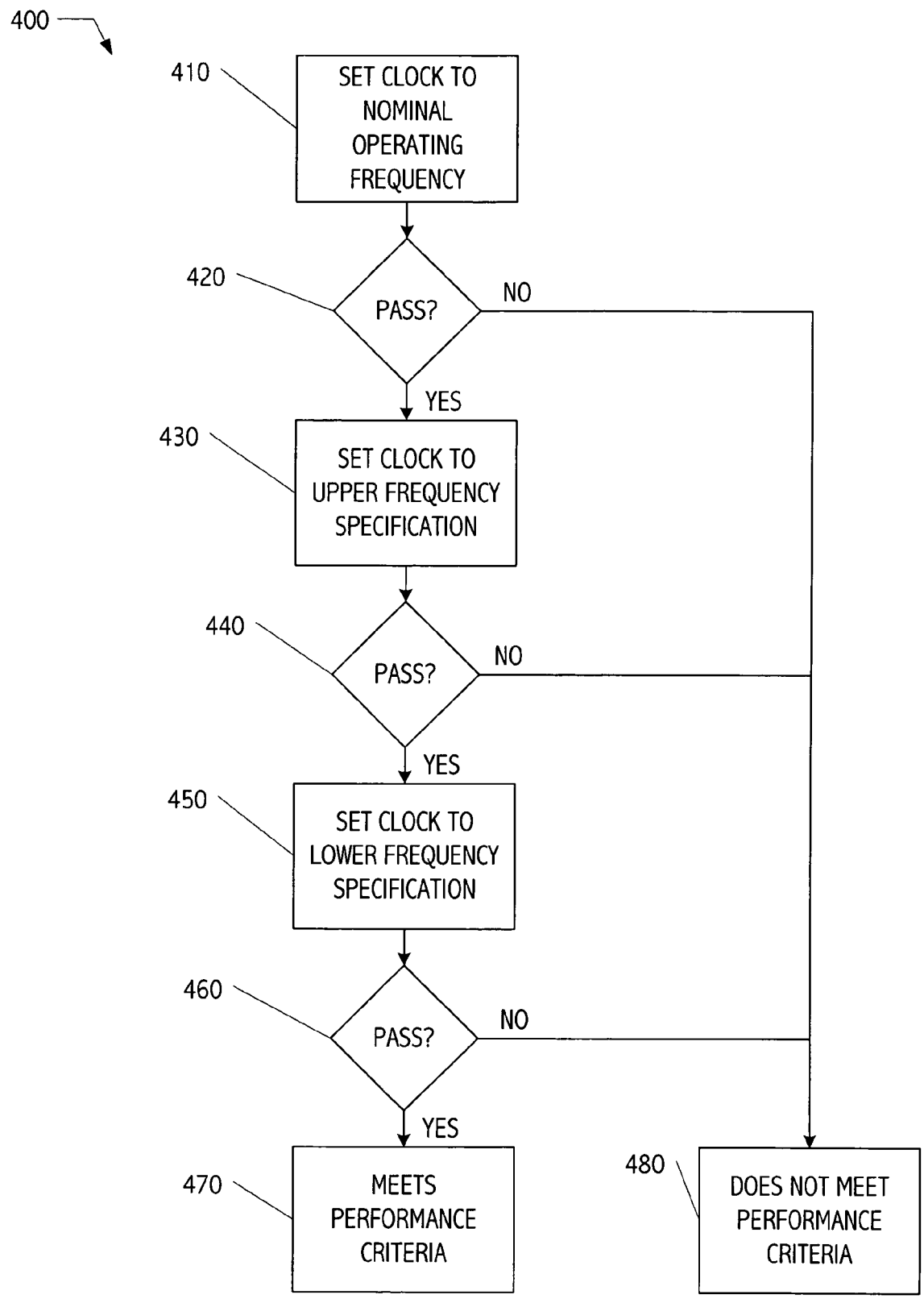
FIG. 4 illustrates information and control flows for an exemplary test facility for determining whether an apparatus meets performance criteria consistent with at least one embodiment of the present invention.

Referring to FIG. 4, an exemplary test facility (e.g., test facility 400) determines an apparent frequency tolerance of an apparatus, e.g., a circuit board. Test facility 400 may be useful during a manufacturing testing phase in which all or certain portions of the circuit board are characterized or evaluated for compliance with applicable standards or other requirements. Test facility 400 configures frequency agile clock source 116 to provide a clock at a nominal operating frequency of a clock dependent circuit under test (e.g., clock dependent circuit 118, SONET/SDH circuit 112, and/or 10 GbE circuit 114) (410). Test facility 400 evaluates the operation of the clock dependent circuit under test at that frequency (420), e.g., by supplying the circuit under test with a known input (e.g., via terminals 119, 120, and/or 121), measuring an output of the circuit under test (e.g., via terminals 119, 120, and/or 121), and comparing the output to an expected value. If the output of the circuit under test is the same as an expected value for the input provided, the circuit under test passes the test at the nominal operating frequency. If the circuit does not produce an acceptable output at the nominal operating frequency, test facility 400 identifies the circuit board as not meeting the applicable performance criteria (480).

Test facility 400 sets frequency agile clock source 116 to an upper frequency specification (430). This upper frequency specification may be a frequency equal to the nominal operating frequency of the circuit under test plus an upper margin. In at least one embodiment of the invention, the upper margin is set to be some percentage of the nominal operating frequency, e.g., ten percent if the circuit under test is required to operate at its nominal operating frequency plus or minus a margin of 10 percent. The upper margin may be set as specified by one or more industry standards, or by other suitable criteria. Note that additional margin may be provided during testing to ensure robust operation of the clock dependent circuit under a wide range of conditions. Thus, a circuit may be tested at frequencies in addition to a specified frequency range.

After setting frequency agile clock source 116 to the upper frequency specification, test facility 400 evaluates the operation of the circuit under test (440). If the circuit does not function properly at the upper frequency specification, the circuit portion is identified as not meeting the applicable performance criteria (480). If the circuit portion passes, i.e., functions acceptably at the upper frequency specification, test facility 400 sets frequency agile clock source 116 to provide a clock signal meeting a lower frequency specification (450). As with the upper frequency specification, the lower frequency specification may be set based on a percentage difference from the nominal operating frequency of the circuit under test. In at least one embodiment of the present invention, test facility 400 sets the lower frequency specification based on the requirements of one or more industry standards or application requirements, however, the upper and lower frequency specifications may be any suitable specifications. In at least one embodiment of the present invention, the upper frequency specification and the lower frequency specification do not have the same absolute frequency difference from the nominal operating frequency. For example, the upper frequency specification may be set to the nominal operating frequency plus five percent while the lower frequency specification may be set to the nominal operating frequency minus eight percent.

Once test facility 400 sets frequency agile clock source 117 to produce a clock signal meeting the lower frequency specification, test facility 400 evaluates the performance of the circuit under test (460). If the circuit under test fails a test at the lower frequency specification, the circuit board is identified as not meeting the performance criteria (480). However, if the circuit under test passes tests at the lower frequency specification, the circuit board is identified as meeting the performance criteria (470) and an apparent frequency tolerance of the system has been identified, i.e., the system performs adequately at least within a specified range.

Figure 5:
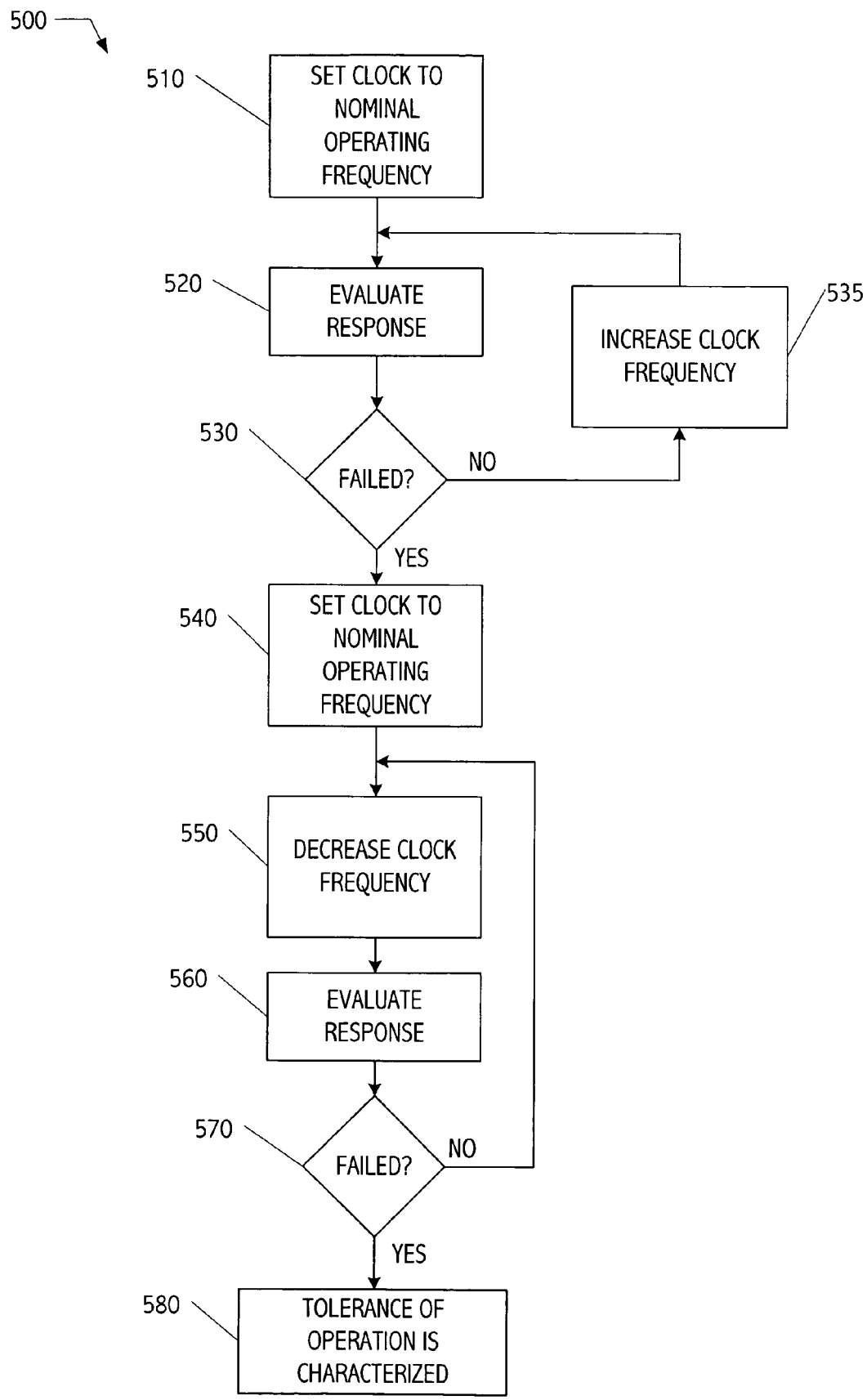
FIG. 5 illustrates information and control flows for an exemplary test facility for characterizing the frequency performance of an apparatus consistent with at least one embodiment of the present invention.

Referring to FIG. 5, a test facility (e.g., test facility 500) determines an actual frequency tolerance of an apparatus, e.g., a circuit board. Test facility 500 may be included as part of a manufacturing test program to characterize portions of a circuit board assembly that may be used in a communication system. Test facility 500 may be performed using a frequency agile clock source that is included on the same circuit board as the clock dependent circuit to be tested. Test facility 500 configures frequency agile clock source 116 to generate a clock signal having a frequency equal to the nominal operating frequency of a circuit under test (510). Test facility 500 evaluates the response of the circuit under test to ensure that the circuit functions adequately when receiving a clock signal at the nominal operating frequency (520). In an exemplary embodiment, test facility 500 provides the circuit under test with a known input (e.g., provided via terminals 119, 120, and/or 121) and compares the circuit output (e.g., received via terminals 119, 120, and/or 121) to an expected value. Other techniques for evaluating the circuit will be apparent to those skilled in the art upon consideration of the present disclosure.

If the evaluation indicates that the circuit under test is performing adequately with a clock signal at the nominal operating frequency, test facility 500 increases the frequency of the clock signal provided by the frequency agile clock source (535). Test facility 500 continues to increase the frequency and evaluate the response of the circuit until a frequency is reached at which the circuit under test fails to function adequately. In at least one embodiment, test facility 500 increases the frequency in percentage increments. Thus, an increment of the frequency corresponds to an increase in the output frequency of the clock source by a predetermined percentage. For example, test facility 500 may increase the frequency of the clock signal upward by two percent for increments in the clock frequency (535).

In at least one embodiment of the present invention, the frequency of the clock source may be adjusted in other predetermined increments regardless of the percentage increase. Since a circuit may be more likely to function properly at frequencies close to a nominal operating frequency of the circuit than at frequencies distant from the nominal operating frequency, the clock frequency may be increased initially by amounts larger than subsequent frequency increases. For example, the first four clock frequency increases may be increases of 100 MHz, while the fifth through eighth clock frequency increases may be in steps of 50 MHz, with subsequent frequency increases being made in 10 MHz steps, or steps having finer resolution. Patterns for clock frequency increases may be chosen according to the circuit type, the frequency range of the circuit, the precision with which the frequency specifications of the circuit must be known, or other suitable criteria.

Once a failure occurs, test facility 500 may reset the operating frequency of the clock to the nominal operating frequency (540). Since the circuit has already been tested at the nominal operating frequency, test facility 500 may proceed by decreasing the clock frequency (550). Similar to the increases of clock frequency described above, the frequency of the clock source may be decreased by amounts consistent with the type of circuit being tested, frequency specifications of the circuit being tested, or the other suitable criteria. After a frequency decrease, test facility 500 evaluates the response of the circuit under test (560). If the results of the evaluation are determined to be acceptable (570), test facility 500 decreases the clock frequency again, and evaluates circuit performance at the decreased clock frequency. Test facility 500 continues to decrease the clock frequency and evaluate the circuit performance until the circuit fails to operate consistent with an appropriate specification. Upon identifying a frequency at which the circuit performance is unacceptable, the actual frequency tolerance of the circuit is known (580).

Since test facility 500 increases the frequency of a signal generated by a frequency agile clock source from the nominal frequency to a frequency at which the circuit fails and decreases the frequency of a signal generated by a frequency agile clock source from the nominal frequency to a frequency at which the circuit fails, an actual characterization of the frequency specifications of the circuit under test can be obtained using a single frequency source included in the circuit board or apparatus being tested. Characterizing the circuit board or other apparatus in such manner allows a manufacturer to distinguish between, and classify accordingly, one circuit board that barely meets required industry standards and another circuit board that may be more robust under various operating conditions because it exceeds required industry standards. Note that the frequency tolerance of the circuit board is determined without probe points that can degrade the transmission line characteristics of the board traces and lower clock performance.

In at least one embodiment of the invention, the frequency agile clock source may be configured in an operational mode after characterizing the circuit performance. In at least one embodiment of the invention, the frequency agile clock source is later programmed to re-enter a test mode for performing further testing of the clock dependent circuit. In at least one embodiment of the invention, further programming is disabled after characterizing the circuit under test and programming the frequency agile clock source to produce a clock signal at a desired frequency.

Test facilities 400 and 500, discussed with reference to FIGS. 4 and 5, respectively, should not be construed to be limited to only the specific sequence order illustrated. The order of operation of either test facility 400 or 500 may be altered consistent with the teachings set forth herein, and fewer or additional actions may be incorporated into either or both test facilities. For example, test facilities 400 and 500 may be combined, with test facility 400 being performed first as a rough performance check, so that an apparatus not meeting the minimum design specifications may be quickly identified. Test facility 500 may then be performed to further characterize units that meet basic performance criteria. As an example of how the order of operation may be varied, with reference to FIG. 5, the low end of a circuit's frequency response may be checked prior to evaluating the high end of the circuit frequency response. Other combinations, variations, and additions may be made consistent with the present disclosure.

The description of the invention set forth herein is illustrative and is not intended to limit the scope of the invention as set forth in the following claims. For example, although the present disclosure refers to circuit boards that include the frequency agile clock source, the teachings herein are equally applicable to other apparatus and systems including such a frequency agile clock source. Furthermore, variations and modifications of the embodiments disclosed herein may be made based on the foregoing description without departing from the scope and spirit of the invention as set forth in the following claims.

What is claimed is:

1. An apparatus comprising:
a circuit board;
a frequency agile clock source comprising a substantially fixed frequency oscillator and a programmable oscillator coupled to the substantially fixed frequency oscillator, the frequency agile clock source supplying an operational clock signal to one or more circuits on the circuit board; and
wherein the frequency agile clock source is programmable to adjust a frequency of the operational clock signal to determine a frequency tolerance of the circuit board,
wherein the frequency of the operational clock signal is programmable above and below a nominal operating frequency of the circuit board sufficient to determine the frequency tolerance of the circuit board,
wherein the frequency of the operational clock signal is programmable to be a frequency at least approximately ten percent higher than and is programmable to be a frequency at least approximately ten percent lower than the nominal operating frequency of the circuit board.

2. The apparatus, as recited in claim 1, wherein the frequency tolerance is an actual frequency tolerance.

3. The apparatus, as recited in claim 1, wherein the frequency tolerance is an apparent frequency tolerance.

4. The apparatus, as recited in claim 1, wherein the operational clock signal has a frequency programmable in increments of approximately 10 ppm or less of a nominal operating frequency of the circuit board.

5. The apparatus, as recited in claim 1, wherein jitter of the operational clock signal is approximately less than 1 picosecond rms for jitter frequencies ranging from 50 kHz to 80 MHz.

6. The apparatus, as recited in claim 1, wherein the one or more circuits comprise at least one of a SONET communications circuit, an SDH communications circuit, and a 10 GbE communications circuit.

7. The apparatus, as recited in claim 1, further comprising:
at least one control node on the circuit board wherein the control node is coupled to configure the operation of the frequency agile clock source.

8. The apparatus, as recited in claim 1, wherein the substantially fixed frequency oscillator is one of a crystal oscillator, a surface acoustic wave (SAW) oscillator, a ceramic oscillator, and a micro-electro mechanical system (MEMS) oscillator.

9. The apparatus, as recited in claim 1, further comprising:
one or more circuits on the circuit board configured to receive the operational clock signal from the frequency agile clock source,
wherein the frequency tolerance of the circuit board is at least partially based on operation of the one or more circuits at the frequency of the operational clock signal.

10. A method comprising:
providing an operational clock signal to at least one circuit on a circuit board, the operational clock signal being based on a substantially fixed frequency signal provided by an oscillator on the circuit board and having a programmable frequency; and
varying the operational clock signal to determine a frequency tolerance of the circuit board based on the operational clock signal,
wherein the frequency of the operational clock signal is programmable in increments of approximately 10 ppm or less of a nominal operating frequency of the circuit board.

11. The method, as recited in claim 10 wherein the frequency tolerance is an actual frequency tolerance.

12. The method, as recited in claim 10 wherein the frequency tolerance is an apparent frequency tolerance.

13. The method, as recited in claim 10 wherein the determining further comprises:
incrementing a frequency of the operational clock signal until the operation of the circuit board fails.

14. The method, as recited in claim 10 wherein the determining further comprises:
decrementing a frequency of the operational clock signal until the operation of the circuit board fails.

15. The method, as recited in claim 10 further comprising:
operating the circuit board at a nominal frequency based on the operational clock signal.

16. The method, as recited in claim 10 further comprising:
maintaining transmission line integrity of the operational clock signal.

17. The method, as recited in claim 10 further comprising:
classifying the circuit board based on the frequency tolerance.

* * * * *